(12) United States Patent
Kim

(10) Patent No.: US 11,475,975 B2
(45) Date of Patent: Oct. 18, 2022

(54) SEMICONDUCTOR MEMORY DEVICE AND METHOD OF OPERATING THE SEMICONDUCTOR MEMORY DEVICE

(71) Applicant: SK hynix Inc., Icheon-si Gyeonggi-do (KR)

(72) Inventor: Jong Wook Kim, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 144 days.

(21) Appl. No.: 17/018,494

(22) Filed: Sep. 11, 2020

(65) Prior Publication Data
US 2021/0327532 A1    Oct. 21, 2021

(30) Foreign Application Priority Data

Apr. 20, 2020 (KR) .................. 10-2020-0047565

(51) Int. Cl.
*G11C 29/00* (2006.01)
*G11C 29/50* (2006.01)
*G11C 16/04* (2006.01)
*G11C 16/14* (2006.01)
*G11C 16/10* (2006.01)

(52) U.S. Cl.
CPC .... *G11C 29/50004* (2013.01); *G11C 16/0483* (2013.01); *G11C 16/10* (2013.01); *G11C 16/14* (2013.01); *G11C 2029/5004* (2013.01)

(58) Field of Classification Search
CPC ... G11C 29/50004; G11C 16/04; G11C 16/83; G11C 16/14; G11C 16/10; G11C 2029/5004
See application file for complete search history.

(56) References Cited

U.S. PATENT DOCUMENTS

2013/0308402 A1* 11/2013 Mu .................. G11C 29/50016
365/201

FOREIGN PATENT DOCUMENTS

KR    1020170053032 A    5/2017
KR    1020170065240 A    6/2017

* cited by examiner

*Primary Examiner* — Samir W Rizk
(74) *Attorney, Agent, or Firm* — William Park & Associates Ltd.

(57) ABSTRACT

The present technology relates to a semiconductor memory device and a method of operating the same. The semiconductor memory device includes a memory block including memory cells, a peripheral circuit configured to program the memory cells in a set program state during a test operation and perform a test erase voltage application operation on the memory cells programmed in the set program state, and control logic configured to control the peripheral circuit to count abnormal memory cells of which a threshold voltage is less than a set threshold voltage among the memory cells.

18 Claims, 13 Drawing Sheets

SEMICONDUCTOR MEMORY DEVICE AND METHOD OF OPERATING THE SEMICONDUCTOR MEMORY DEVICE

CROSS-REFERENCE TO RELATED APPLICATION

The present application claims priority under 35 U.S.C. § 119(a) to Korean patent application number 10-2020-0047565, filed on Apr. 20, 2020, in the Korean Intellectual Property Office, the entire disclosure of which is incorporated herein by reference.

BACKGROUND

1. Technical Field

The present disclosure relates to an electronic device, and more particularly, to a semiconductor memory device and a method of operating the semiconductor memory device.

2. Related Art

Recently, a paradigm for a computer environment has been transformed into ubiquitous computing, which enables a computer system to be used whenever and wherever. Therefore, a use of a portable electronic device such as a mobile phone, a digital camera, and a notebook computer is rapidly increasing. Such a portable electronic device generally uses a memory system that uses a semiconductor memory device, that is, a data storage device. The data storage device is used as a main storage device or an auxiliary storage device of the portable electronic device.

The semiconductor data storage device using the memory device has advantages that stability and durability are excellent because there is no mechanical driver, an access speed of information is very fast, and power consumption is low. As an example of the memory system having such advantages, a data storage device includes a universal serial bus (USB) memory device, a memory card having various interfaces, a solid state drive (SSD), and the like.

A memory device is largely divided into a volatile memory device and a non-volatile memory device.

A writing speed and a reading speed of the non-volatile memory device are relatively slow, however, the non-volatile memory device maintains storage data even though power supply is shut off. Therefore, a non-volatile memory device is used to store data to be maintained regardless of power supply. A non-volatile memory device includes a read only memory (ROM), a mask ROM (MROM), a programmable ROM (PROM), an erasable programmable ROM (EPROM), an electrically erasable programmable ROM (EEPROM), a flash memory, a phase change random access memory (PRAM), a magnetic RAM (MRAM), a resistive RAM (RRAM), a ferroelectric RAM (FRAM), and the like. The flash memory is divided into a NOR type and a NAND type.

SUMMARY

A semiconductor memory device according to an embodiment of the present disclosure may include a memory block including memory cells, peripheral circuits configured to program the memory cells in a set program state during a test operation and perform a test erase voltage application operation on the memory cells programmed in the set program state, and a control logic configured to control the peripheral circuits to count abnormal memory cells of which a threshold voltage is lower than a set threshold voltage among the memory cells.

A method of operating a semiconductor memory device according to an embodiment of the present disclosure may include programming a memory block in a set program state, applying a test erase voltage to the memory block programmed in the set program state set number of times, counting memory cells of which a threshold voltage is lower than a lowest threshold voltage of the set program state among memory cells included in the memory block, and determining the memory block as a bad block when the number of counted memory cells is greater than a set number.

A semiconductor memory device according to an embodiment of the present disclosure may include a memory block including memory cells of an erase state, peripheral circuits configured to perform a test program voltage application operation on the memory cells of the erase state during a test operation, and a control logic configured to control the peripheral circuits to count abnormal memory cells of which a threshold voltage is higher than a set threshold voltage among the memory cells.

A method of operating a semiconductor memory device according to an embodiment of the present disclosure may include applying a test program voltage to a memory block of an erase state set number of times, counting memory cells of which a threshold voltage is higher than a highest threshold voltage of the erase state among memory cells included in the memory block, and determining the memory block as a bad block when the number of counted memory cells is greater than a set number.

A semiconductor memory device according to an embodiment of the present disclosure may include a memory block including memory cells, peripheral circuits configured to program the memory cells in a set program state during a test operation and perform a test erase voltage application operation on the memory cells programmed in the set program state, and a control logic configured to control the peripheral circuits to measure a slope of a left tail of a threshold voltage distribution of the memory cells, and the control logic determines the memory block as a bad block when the measured slope of the left tail is lower than a set slope.

A method of operating a semiconductor memory device according to an embodiment of the present disclosure may include programming a memory block including memory cells in a set program state, applying a test erase voltage to the memory block programmed in the set program state a set number of times, measuring a slope of a left tail of a threshold voltage distribution of the memory cells, and determining the memory block as a bad block when the slope of the left tail is lower than a set slope.

A semiconductor memory device according to an embodiment of the present disclosure may include a memory block including memory cells of an erase state, peripheral circuits configured to perform a test program voltage application operation on the memory cells of the erase state during a test operation, and a control logic configured to control the peripheral circuits to measure a slope of a right tail of a threshold voltage distribution of the memory cells, and the control logic determines the memory block as a bad block when the measured slope of the right tail is lower than a set slope.

A method of operating a semiconductor memory device according to an embodiment of the present disclosure may include applying a test program voltage to a memory block of an erase state set number of times, measuring a slope of a right tail of a threshold voltage distribution of memory cells, and determining the memory block as a bad block when the slope of the right tail is lower than a set slope.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

Hereinafter, embodiments of the present disclosure will be described in detail with reference to the accompanying drawings, so that those skilled in the art to which the present disclosure pertains may easily carry out the technical spirit of the present disclosure.

An embodiment of the present disclosure may provide a semiconductor memory device detecting abnormally programmed or erased memory cells among memory cells included in the semiconductor memory device, and a method of operating the semiconductor memory device.

According to the present technology, reliability of a semiconductor memory device may be improved by detecting memory cells of which a threshold voltage is changed by a test program voltage lower than a normal program voltage or a test erase voltage lower than a normal erase voltage among memory cells included in the semiconductor memory device.

Figure 1:
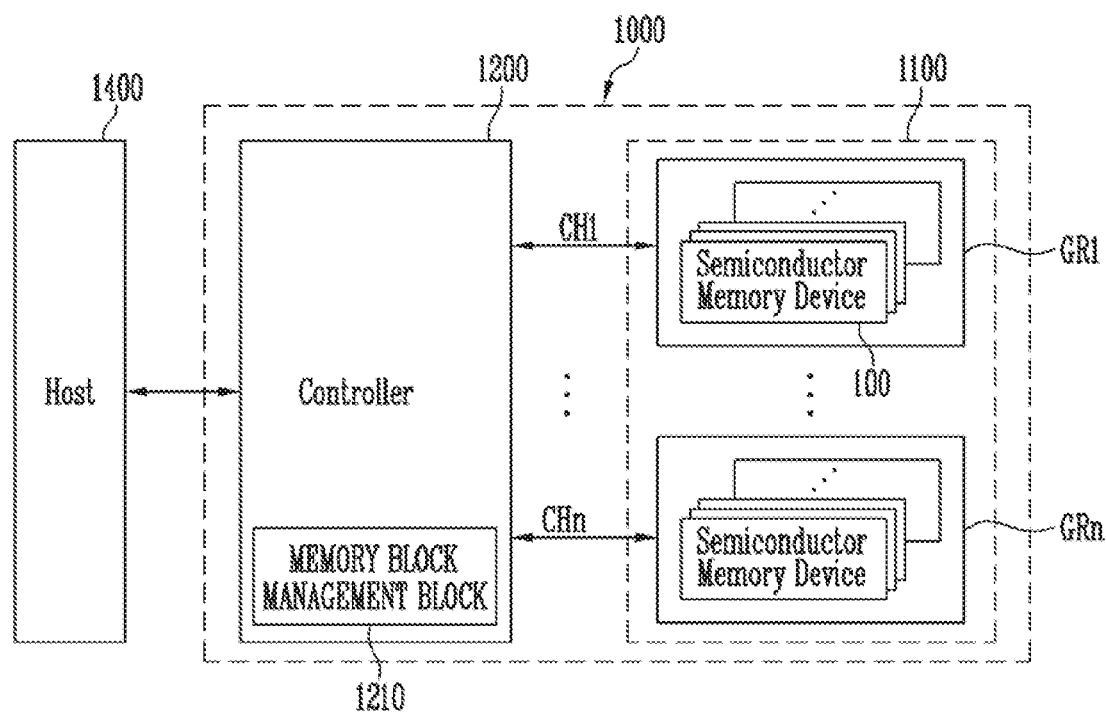
FIG. 1 is a block diagram for describing a memory system according to an embodiment of the present disclosure.

FIG. 1 is a block diagram for describing a memory system according to an embodiment of the present disclosure.

Referring to FIG. 1, the memory system 1000 includes a memory device 1100 and a controller 1200. The memory device 1100 includes a plurality of semiconductor memory devices 100. The plurality of semiconductor memory devices 100 may be divided into a plurality of groups GR1 to GRn.

In FIG. 1, the plurality of groups GR1 to GRn communicates with the controller 1200 through first to n-th channels CH1 to CHn, respectively. Each semiconductor memory device 100 will be described later with reference to FIG. 2.

Each of the plurality of groups GR1 to GRn is configured to communicate with the controller 1200 through one common channel. The controller 1200 is configured to control the plurality of semiconductor memory devices 100 of the memory device 1100 through a plurality of channels CH1 to CHn. Each of the semiconductor memory devices 100 may include a plurality of memory blocks, and in an embodiment, each of the semiconductor memory devices 100 may perform a test operation to detect abnormal memory cells in which a threshold voltage is abnormally moved. A memory block in which the number of detected abnormal memory cells is equal to or greater than a set number may be registered as a bad block. In addition, during the test operation, the semiconductor memory device 100 may select a representative block on which a test operation is to be performed among the plurality of memory blocks, and when the selected representative block is determined as the bad block as a result of the test operation, the semiconductor memory device 100 may be determined as a defective memory chip.

In an embodiment, each of the semiconductor memory devices 100 may perform the test operation to detect a slope of a threshold voltage distribution and determine a memory block in which the detected slope value is lower than a set slope value as the bad block.

The controller 1200 is connected between a host 1400 and the memory device 1100. The controller 1200 is configured to access the memory device 1100 in response to a request from the host 1400. For example, the controller 1200 is configured to control read, write, erase, and background operations of the memory device 1100 in response to the request received from the host 1400. The controller 1200 is configured to provide an interface between the memory device 1100 and the host 1400. The controller 1200 is configured to drive firmware for controlling the memory device 1100.

The controller 1200 may include a memory block management block 1210. The memory block management block 1210 stores information on each of the plurality of memory blocks included in the semiconductor memories 100. For example, the memory block management block 1210 may store information on the memory blocks determined as the bad block among the memory blocks included in the semiconductor memories 100 and information on memory blocks determined as a normal block, and may receive bad block information according to a test operation result of the semiconductor memories 100 to update the stored information.

The host 1400 controls the memory system 1000. The host 1400 includes a portable electronic device such as a computer, a PDA, a PMP, an MP3 player, a camera, a camcorder, and a mobile phone. The host 1400 may request a write operation, a read operation, an erase operation, and the like of the memory system 1000 through a command.

The controller 1200 and the memory device 1100 may be integrated into one semiconductor device. In an embodiment, the controller 1200 and the memory device 1100 may be integrated into one semiconductor device to form a memory card. For example, the controller 1200 and the memory device 1100 may be integrated into one semiconductor device to form a memory card such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and a universal flash memory (UFS).

The controller 1200 and the memory device 1100 may be integrated into one semiconductor device to form a semiconductor drive (solid state drive (SSD)). The semiconductor drive (SSD) includes a storage device configured to store data in a semiconductor memory. When the memory system 1000 is used as the semiconductor drive (SSD), an operation speed of the host 1400 connected to the memory system 1000 may be dramatically improved.

As another example, the memory system 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

In an embodiment, the memory device 1100 or memory system 1000 may be mounted as a package of various types. For example, the memory device 1100 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline (SOIC), a shrink small outline package (SSOP), a thin small outline (TSOP), a system in package (SIP), a multi-chip package (MCP), a wafer-level fabricated package (WFP), or a wafer-level processed stack package (WSP).

Figure 2:
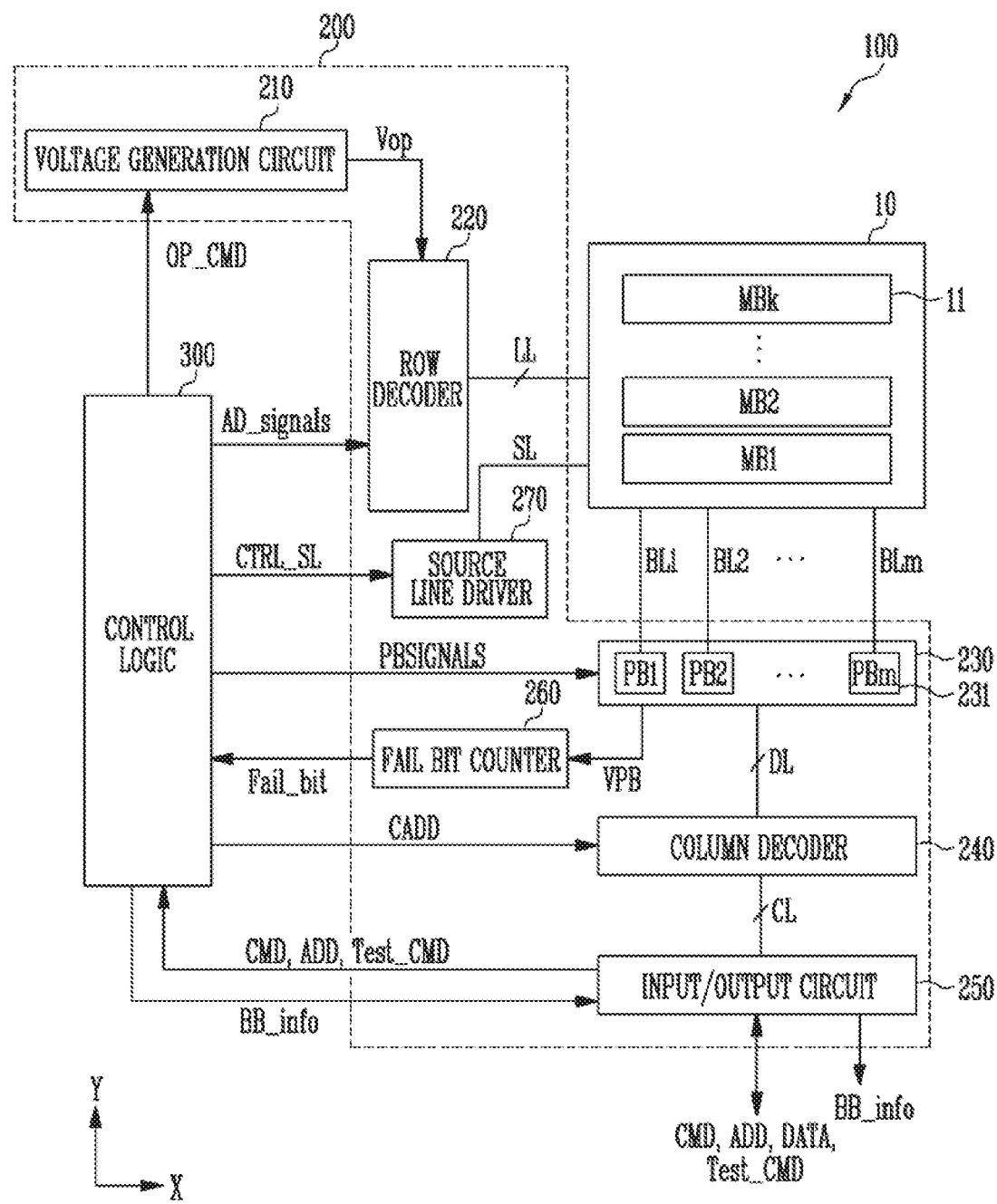
FIG. 2 is a block diagram for describing a configuration of a semiconductor memory device of FIG. 1.

FIG. 2 is a block diagram for describing a configuration of the semiconductor memory device of FIG. 1.

Referring to FIG. 2, the semiconductor memory device 100 may include a memory cell array 10 in which data is stored. The semiconductor memory device 100 may include a peripheral circuit 200 configured to perform a program operation for storing data in the memory cell array 10, a read operation for outputting the stored data, and an erase operation for erasing the stored data. In addition, the peripheral circuit 200 may perform a test operation. During the test operation, the peripheral circuit 200 may sequentially perform a test program operation and a test erase voltage application operation on a selected memory block among a plurality of memory blocks MB1 to MBk included in the memory cell array 10, and then may read the threshold voltage distribution to detect the abnormal memory cells. In addition, during the test operation, the peripheral circuit 200 may perform a test program voltage application operation on a selected memory block of an erase state among the plurality of memory blocks MB1 to MBk, and then may read the threshold voltage distribution to detect the abnormal memory cells.

In an embodiment, the peripheral circuit 200 may perform the test operation. During the test operation, the peripheral circuit 200 may sequentially perform a test program operation and a test erase voltage application operation on a selected memory block among the plurality of memory blocks MB1 to MBk included in the memory cell array 10, and then may measure a slope of the threshold voltage distribution. In addition, during the test operation, the peripheral circuit 200 may perform a test program voltage application operation on a selected memory block of an erase state among the plurality of memory blocks MB1 to MBk, and then may measure the slope of the threshold voltage distribution.

The semiconductor memory device 100 may include control logic 300 that controls the peripheral circuit 200 under control of the controller 1200 of FIG. 1. The control logic 300 may be implemented as hardware, software, or a combination of hardware and software. For example, the control logic 300 may be a control logic circuit operating in accordance with an algorithm and/or a processor executing control logic code.

The memory cell array 10 may include a plurality of memory blocks MB1 to MBk; 11 (k is a positive integer). At least one of the plurality of memory blocks MB1 to MBk may be a content-addressable memory (CAM) block, and the CAM block may store a bad block table. Local lines LL and bit lines BL1 to BLm (m is a positive integer) may be connected to each of the memory blocks MB1 to MBk; 11. For example, the local lines LL may include a first select line, a second select line, and a plurality of word lines arranged between the first and second select lines. In addition, the local lines LL may include dummy lines arranged between the first select line and the word lines, and between the second select line and the word lines. Here, the first select line may be a source select line, and the second select line may be a drain select line. For example, the local lines LL may include the word lines, the drain and source select lines, and source lines SL. For example, the local lines LL may further include the dummy lines. For example, the local lines LL may further include pipe lines. The local lines LL may be connected to the memory blocks MB1 to MBk; 11, respectively, and the bit lines BL1 to BLm may be commonly connected to the memory blocks MB1 to MBk; 11. The memory blocks MB1 to MBk; 11 may be implemented in a two-dimensional or three-dimensional structure. For example, the memory cells may be arranged in a direction parallel to a substrate in the memory block 11 of the two-dimensional structure. For example, the memory cells may be stacked in a direction perpendicular to the substrate in the memory block 11 of the three-dimensional structure.

The peripheral circuit 200 may be configured to perform the program, read, and erase operations of the selected memory block 11 under control of the control logic 300. For example, the peripheral circuit 200 may include a voltage generation circuit 210, a row decoder 220, a page buffer group 230, a column decoder 240, an input/output circuit 250, a fail bit counter 260, and a source line driver 270.

The voltage generation circuit 210 may generate various operation voltages Vop used in the program, read, and erase operations in response to an operation signal OP_CMD. In addition, the voltage generation circuit 210 may selectively discharge the local lines LL in response to the operation signal OP_CMD. For example, the voltage generation circuit 210 may generate a program voltage, a verify voltage, a read voltage, a pass voltage, and a select transistor operation voltage under the control of the control logic 300.

The row decoder 220 may transfer the operation voltages Vop to the local lines LL connected to the selected memory block 11 in response to row decoder control signals AD_signals. For example, the row decoder 220 may selectively apply the operation voltages (for example, the program voltage, the verify voltage, the read voltage, the pass voltage, and the like) generated in the voltage generation circuit 210 in response to the control signals AD_signals to the word lines among the local lines LL.

For example, the row decoder 220 applies the program voltage generated in the voltage generation circuit 210 to the selected word line among the local lines LL and applies the pass voltage generated in the voltage generation circuit 210 to the remaining unselected word lines, in response to the row decoder control signals AD_signals during the program operation. In addition, the row decoder 220 applies the read voltage generated in the voltage generation circuit 210 to the selected word line among the local lines LL and applies the pass voltage generated in the voltage generation circuit 210 to the remaining unselected word lines, in response to the row decoder control signals AD_signals during the read operation.

The page buffer group 230 may include a plurality of page buffers PB1 to PBm; 231 connected to the bit lines BL1 to BLm. The page buffers PB1 to PBm; 231 may operate in response to page buffer control signals PBSIGNALS. For example, the page buffers PB1 to PBm; 231 may temporarily store data to be programmed during the program operation or sense a voltage or a current of the bit lines BL1 to BLm during the read operation or the verify operation. In addition, the page buffers PB1 to PBm; 231 may apply an erase voltage to corresponding bit lines BL1 to BLm or float the bit lines BL1 to BLm during the erase operation.

The page buffer group 230 may detect memory cells of which a threshold voltage is lower than a solid program state in a detection operation of the abnormal memory cells during the test operation, and may generate a page buffer voltage VPB of which a potential level is adjusted based on the number of detected memory cells. In addition, the page buffer group 230 may detect memory cells of which the threshold voltage is higher than the solid program state in the detection operation of the abnormal memory cells, and may generate the page buffer voltage VPB of which the potential level is adjusted based on the number of detected memory cells.

The column decoder 240 may transfer data between the input/output circuit 250 and the page buffer group 230 in response to a column address CADD. For example, the column decoder 240 may exchange data with the page buffers 231 through data lines DL, or may exchange data with the input/output circuit 250 through column lines CL.

The input/output circuit 250 may transfer an internal command CMD, a test command Test_CMD, and an address ADD received from the controller 1200 of FIG. 1 to the control logic 300, or may receive bad block information BB_info from the control logic 300 and transfer the bad block information BB_info to the controller 1200. In addition, the input/output circuit 250 may exchange data DATA with the column decoder 240.

The fail bit counter 260 may count abnormal memory cells of which a threshold voltage is lower than a reference read voltage when detecting the abnormal memory cells during the test operation, and may output the number of counted abnormal memory cells as a fail bit Fail_bit. In addition, the fail bit counter 260 may count abnormal memory cells of which a threshold voltage is higher than a read voltage when detecting the abnormal memory cells, and may output the number of counted abnormal memory cells as the fail bit Fail_bit.

The source line driver 270 may be connected to the memory cell included in the memory cell array 10 through the source line SL and may control a voltage applied to the source line SL. The source line driver 270 may receive a source line control signal CTRL_SL from the control logic 300 and may control a source line voltage (for example, an erase voltage) applied to the source line SL based on the source line control signal CTRL_SL.

The control logic 300 may output an operation signal OP_CMD, a row decoder control signal AD_signals, and page buffer control signals PBSIGNALS in response to the internal command CMD and the address ADD to control the peripheral circuit 200 to perform overall operations, for example, the program operation, the read operation, the erase operation, and the like. In addition, the control logic 300 may control the peripheral circuit 200 to perform the test operation on a selected memory block in response to a test command Test_CMD. For example, during the test operation, the control logic 300 may control the peripheral circuit 200 to sequentially perform the test program operation and the test erase voltage application operation on the selected memory block among the plurality of memory blocks MB1 to MBk included in the memory cell array 10, and then read the threshold voltage distribution to detect the abnormal memory cells. In addition, during the test operation, the control logic 300 may control the peripheral circuit 200 to perform the test program voltage application operation on the selected memory block of the erase state among the plurality of memory blocks MB1 to MBk, and then may read the threshold voltage distribution to detect the abnormal memory cells. When the number of detected abnormal memory cells exceeds a set number, the control logic 300 may determine the selected memory block as the bad block and generate the bad block information BB_info.

In another embodiment, during the test operation, the control logic 300 may control the peripheral circuit 200 to sequentially perform the test program operation and the test erase voltage application operation on the selected memory block among the plurality of memory blocks MB1 to MBk included in the memory cell array 10, and then may measure the slope of the threshold voltage distribution. In addition, during the test operation, the control logic 300 may control the peripheral circuit 200 to perform the test program voltage application operation on the selected memory block of the erase state among the plurality of memory blocks MB1 to MBk, and then may measure the slope of the threshold voltage distribution. When the detected slope value of the threshold voltage distribution is lower than the set slope value, the control logic 300 may determine the selected memory block as the bad block and generate the bad block information BB_info.

Figure 3:
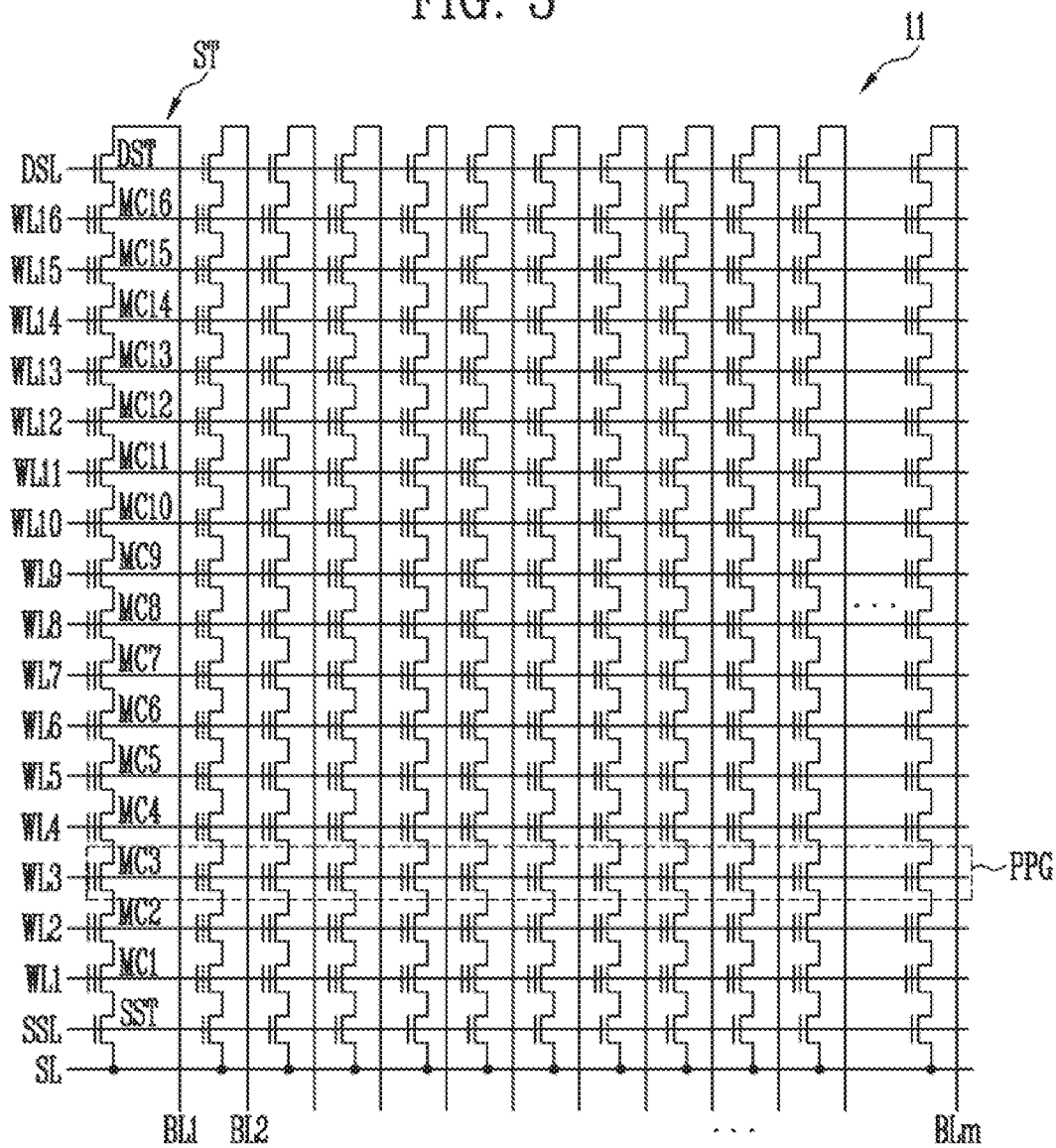
FIG. 3 is a diagram for describing a memory block of FIG. 2.

FIG. 3 is a diagram for describing the memory block of FIG. 2.

Referring to FIG. 3, the memory block 11 may be connected to a plurality of word lines WL1 to WL16 arranged in parallel with each other between the first select line and the second select line. Here, the first select line may be the source select line SSL, and the second select line may be the drain select line DSL. More specifically, the memory block 11 may include a plurality of strings ST connected between the bit lines BL1 to BLm and the source line SL. The bit lines BL1 to BLm may be connected to the strings ST, respectively, and the source line SL may be commonly connected to the strings ST. Since the strings ST may be configured to be identical to each other, a string ST connected to the first bit line BL1 will be specifically described, as an example.

The string ST may include a source select transistor SST, a plurality of memory cells MC1 to MC16, and a drain select transistor DST connected in series between the source line SL and the first bit line BL1. One string ST may include at least one or more of the source select transistor SST and the drain select transistor DST, and may include the memory cells MC1 to MC16 more than the number shown in the figure.

A source of the source select transistor SST may be connected to the source line SL and a drain of the drain select transistor DST may be connected to the first bit line BL1. The memory cells MC1 to MC16 may be connected in series between the source select transistor SST and the drain select transistor DST. Gates of the source select transistors SST included in the different strings ST may be connected to the source select line SSL, gates of the drain select transistors DST may be connected to the drain select line DSL, and gates of the memory cells MC1 to MC16 may be connected to the plurality of word lines WL1 to WL16. A group of the memory cells connected to the same word line among the memory cells included in different strings ST may be referred to as a physical page PPG. Therefore, the memory block 11 may include the physical pages PPG of the number of the word lines WL1 to WL16.

One memory cell may store one bit of data. This is commonly referred to as a single level cell (SLC). In this case, one physical page PPG may store one logical page (LPG) data. One logical page (LPG) data may include data bits of the number of cells included in one physical page PPG. In addition, one memory cell may store two or more bits of data. This is commonly referred to as a multi-level cell (MLC). In this case, one physical page PPG may store two or more logical page (LPG) data.

Figure 4:
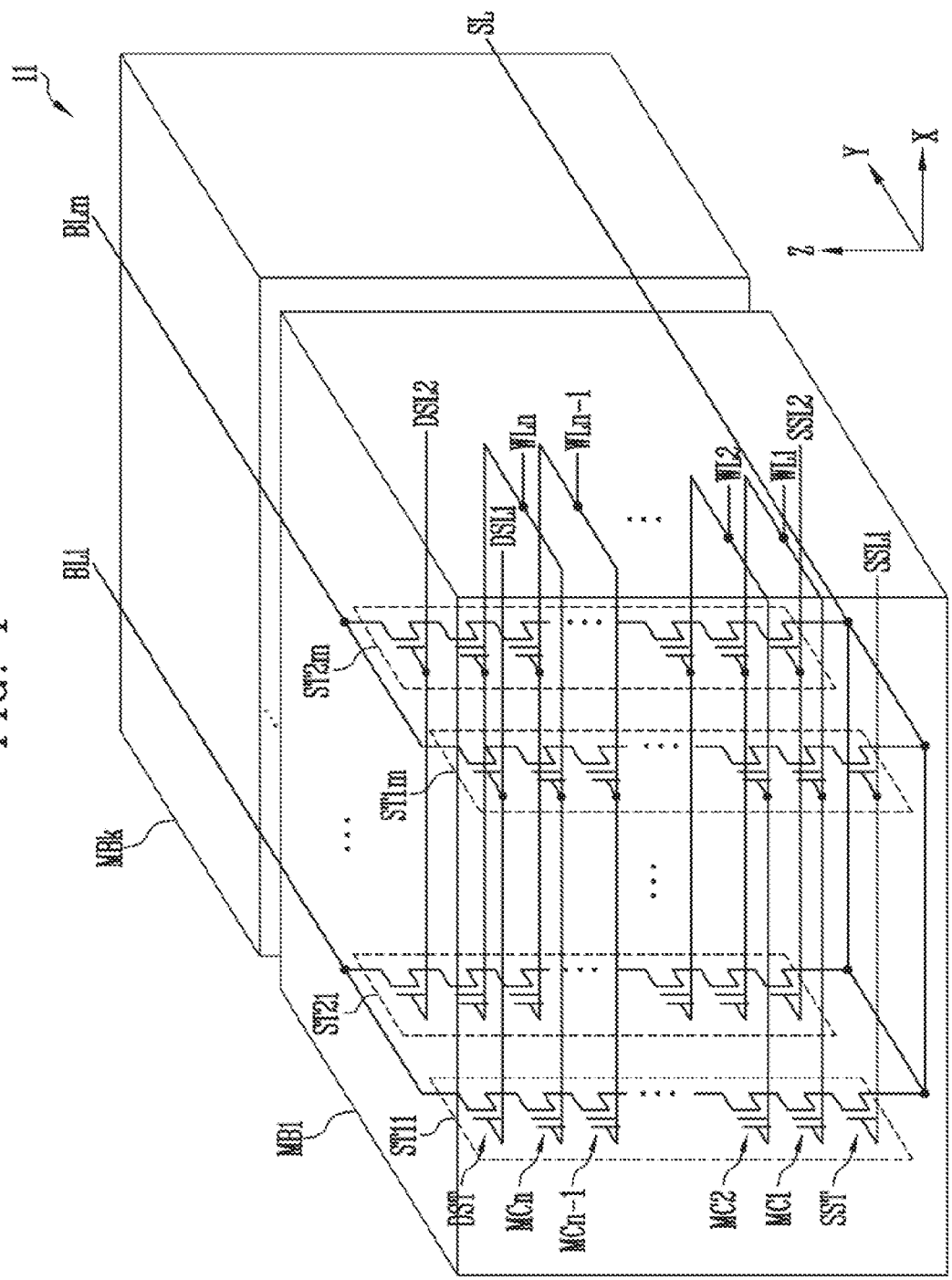
FIG. 4 is a diagram for describing an embodiment of a memory block configured in a three-dimension.

FIG. 4 is a diagram for describing an embodiment of a memory block configured in a three-dimension.

Referring to FIG. 4, the memory cell array 10 may include a plurality of memory blocks MB1 to MBk; 11. The memory blocks 11 may include a plurality of strings ST11 to ST1$m$ and ST21 to ST2$m$. Each of the plurality of strings ST11 to ST1$m$ and ST21 to ST2$m$ may be extended in a vertical direction (Z direction). In the memory blocks 11, m strings may be arranged in a row direction (X direction). In FIG. 4, two strings are arranged in a column direction (Y direction), but this is for convenience of description, and three or more strings may be arranged in the column direction (Y direction).

Each of the plurality of strings ST11 to ST1$m$ and ST21 to ST2$m$ may include at least one source select transistor SST, first to n-th memory cells MC1 to MCn, and at least one drain select transistor DST.

The source select transistor SST of each string may be connected between the source line SL and the memory cells MC1 to MCn. The source select transistors of the strings arranged in the same row may be connected to the same source select line. The source select transistors of the strings ST11 to ST1$m$ arranged in the first row may be connected to a first source select line SSL1. The source select transistors of the strings ST21 to ST2$m$ arranged in the second row may be connected to a second source select line SSL2. In an embodiment, the source select transistors of the strings ST11 to ST1$m$ and ST21 to ST2$m$ may be commonly connected to one source select line.

The first to n-th memory cells MC1 to MCn of each string may be connected to each other in series between the source select transistor SST and the drain select transistor DST. Gates of the first to n-th memory cells MC1 to MCn may be connected to the first to n-th word lines WL1 to WLn, respectively.

As an embodiment, at least one of the first to n-th memory cells MC1 to MCn may be used as a dummy memory cell. When the dummy memory cell is provided, a voltage or a current of a corresponding string may be stably controlled. Therefore, reliability of the data stored in the memory block 11 may be improved.

The drain select transistor DST of each string may be connected between the bit line and the memory cells MC1 to MCn. The drain select transistors DST of the strings arranged in the row direction may be connected to the drain select line extending in the row direction. The drain select transistors DST of the strings ST11 to ST1$m$ of the first row may be connected to a first drain select line DSL1. The drain select transistors DST of the strings ST21 to ST2$m$ of the second row may be connected to a second drain select line DSL2.

In the plurality of memory blocks MB1 to MBk, one memory block may share the word lines WL1 to WLn with another memory block, and the memory blocks sharing the word lines WL1 to WLn may be defined as a shared memory block.

Figure 5:
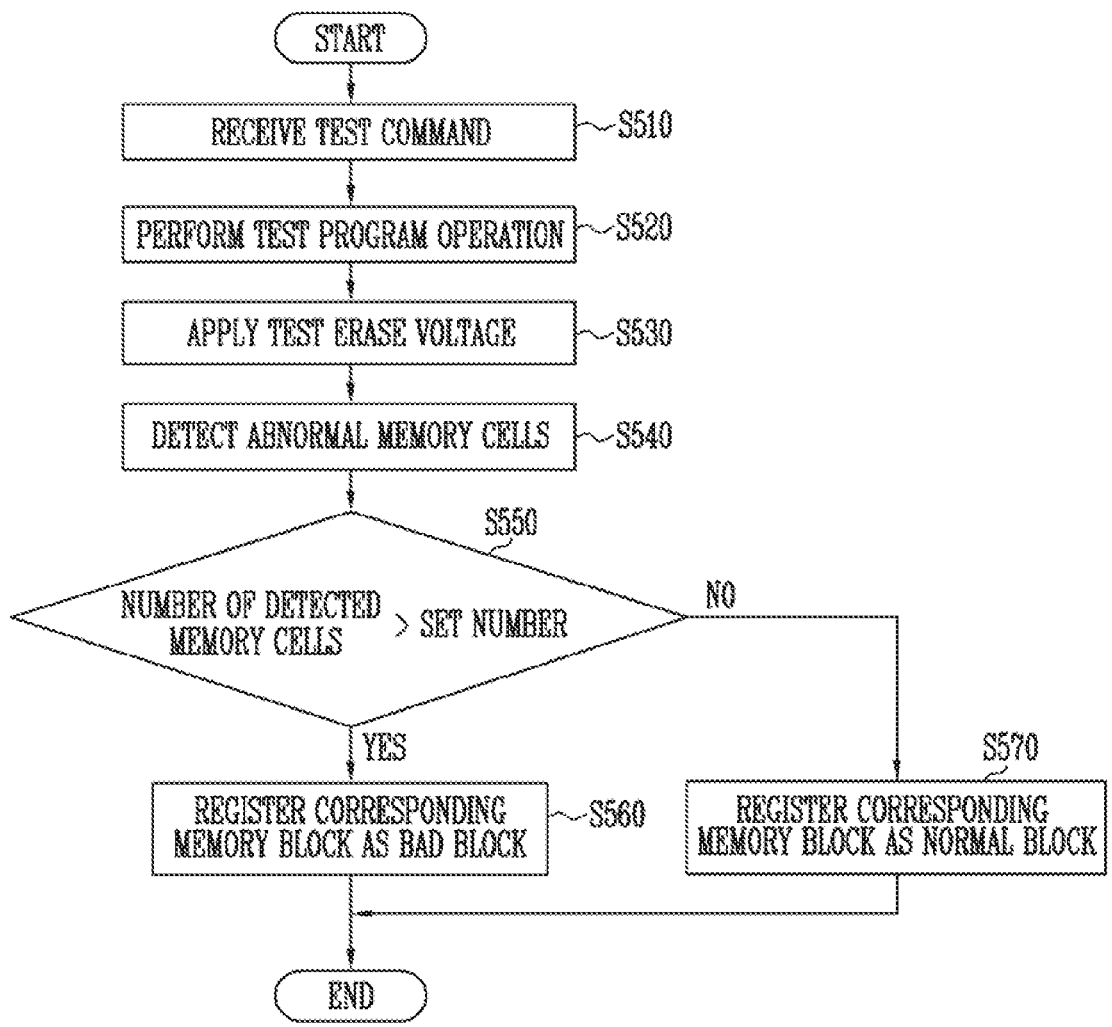
FIG. 5 is a flowchart for describing a method of operating the semiconductor memory device according to a first embodiment of the present disclosure.

FIG. 5 is a flowchart for describing a method of operating the semiconductor memory device according to a first embodiment of the present disclosure.

The method of operating the semiconductor memory device according to the first embodiment of the present disclosure will be described with reference to FIGS. 1 to 5 as follows.

In step S510, during the test operation, the selected semiconductor memory device 100 included in the memory device 1100 receives the test command Test_CMD from the controller 1200. The control logic 300 of the selected semiconductor memory device 100 may control the peripheral circuit 200 to perform the test operation on the selected memory block (for example, MB1) among the plurality of memory blocks MB1 to MBk included in the memory cell array 10, in response to the received test command Test_CMD.

In step S520, the peripheral circuit 200 perform the test program operation on the selected memory block MB1 under the control of the control logic 300. For example, the memory cells included in the test program operation selected memory block MB1 are programmed in a solid program state. The solid program state may be a program state corresponding to a specific threshold voltage distribution of a potential higher than a threshold voltage distribution corresponding to the erase state. For example, the solid program state may have a threshold voltage distribution higher than 0V.

In an embodiment of the present disclosure, the memory cells included in the selected memory block MB1 are programmed in the solid program state during the test program operation, but are not limited thereto, and random data may be programmed in the memory cells included in the selected memory block MB1.

In step S530, a test erase voltage is applied to the selected memory block MB1 on which the test program operation is completed. The test erase voltage may be an erase voltage of which a potential level is lower than an erase voltage used during the erase operation of the semiconductor memory device 100, that is, a normal erase voltage.

For example, during the test erase voltage application operation, the source line driver 270 may apply the test erase voltage to the source line SL of the selected memory block MB1. The page buffers PB1 to PBm; 231 may apply the test erase voltage to the corresponding bit lines BL1 to BLm or float the bit lines BL1 to BLm during the test erase operation. During the test erase voltage application operation, the row decoder 220 may apply a ground voltage to the word lines WL of the selected memory block MB1.

When the test erase voltage is applied to the source line SL or the source line SL and the bit lines BL1 to BLm of the selected memory block MB1, since the test erase voltage is lower than the normal erase voltage, the threshold voltage of the normal memory cells among the memory cells included in the selected memory block MB1 is not changed, and the threshold voltage of the abnormal memory cells of which an erase speed is fast is decreased.

The above-described test erase voltage application operation may be repeatedly performed by setting a number of times the test erase voltage application operation is performed. For example, the test erase voltage application operation may be repeatedly performed 100 times to 1000 times.

In step S540, after the test erase voltage application operation is completed, the abnormal memory cells of which the threshold voltage is decreased are detected. For example, the peripheral circuit 200 detects memory cells having a threshold voltage lower than the lowest threshold voltage of the solid program state among the plurality of memory cells included in the selected memory block MB1. The detection operation of the abnormal memory cells may be performed as a read operation using a read voltage of which a potential is equal to or lower than the lowest threshold voltage of the solid program state.

In step S550, it is determined whether the number of detected abnormal memory cells is greater than a set number. For example, the page buffer group 230 generates and outputs the page buffer voltage VPB according to the number of abnormal memory cells detected during the detection operation of the above-described abnormal memory cells, that is, the memory cells having the threshold voltage lower than the lowest threshold voltage of the solid program state. The fail bit counter 260 counts the number of abnormal memory cells based on a potential of the page buffer voltage VPB, and generates and outputs the fail bit Fail_bit. The control logic 300 determines whether the number of abnormal memory cells is greater than the set number based on the fail bit Fail_bit.

When it is determined that the number of detected abnormal memory cells is greater than the set number as a result of the determination of step S550 described above (Yes), the selected memory block MB1 is determined as the bad block and is registered in the memory block management block 1210. For example, when the number of abnormal memory cells among the memory cells included in the selected memory block MB1 is greater than the set number, the control logic 300 generates and outputs the bad block information BB_info, and the memory block management block of the controller 1200 registers the selected memory block MB1 as the bad block based on the bad block information BB_info and manages the selected memory block MB1.

When it is determined that the number of detected abnormal memory cells is equal to or less than the set number as a result of the determination of step S550 described above (No), the selected memory block MB1 is determined as the normal block and is registered in the memory block management block 1210.

According to the above-described embodiment of the present disclosure, after programming the memory cells included in the selected memory block in a specific program state, the test erase voltage lower than the normal erase voltage is applied to detect the abnormal memory cells of which the threshold voltage is decreased. When the number of detected abnormal memory cells is greater than the set number, the corresponding memory block may be determined as the bad block.

In the above-described embodiment of the present disclosure, the test program operation and the abnormal memory cells detection operation are performed on all memory cells included in the selected memory block. However, the test program operation and the abnormal memory cells detection operation may be performed on some of the memory cells included in the selected memory block. For example, the test program operation and the abnormal memory cells detection operation may be selectively performed on memory cells included in at least one page among a plurality of pages included in the selected memory block or memory cells included in at least one string among a plurality of strings included in the selected memory block. Alternatively, the test program operation and the abnormal memory cells detection operation may be selectively performed on memory cells selected by, for example but not limited to, a checkerboard method among the plurality of memory cells included in the selected memory block.

Figure 6:
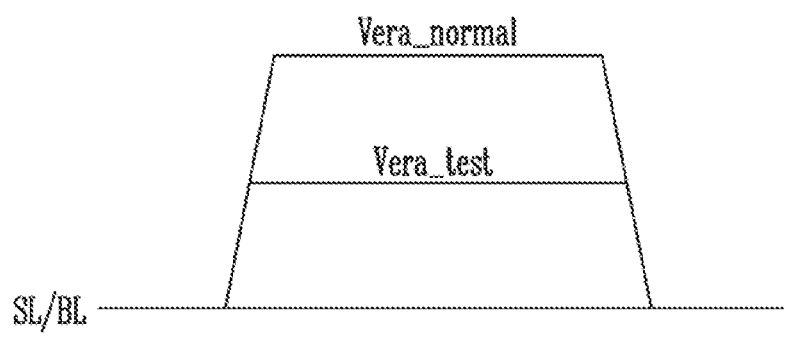
FIG. 6 is a waveform diagram for describing a test erase voltage during a test erase voltage application operation of FIG. 5.

FIG. 6 is a waveform diagram for describing the test erase voltage during the test erase voltage application operation of FIG. 5.

Referring to FIG. 6, the test erase voltage Vera_test applied to the source line SL or the source line SL and the bit lines BL in step S530 of FIG. 5 has a potential level lower than that of the normal erase voltage Vera_normal used during the erase operation of the semiconductor memory device, that is, the normal erase operation.

Figure 7:
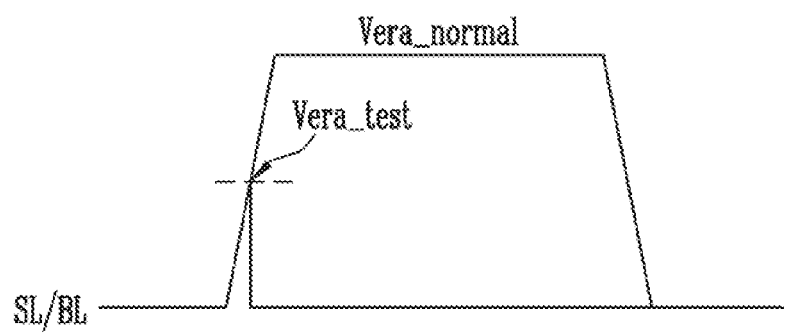
FIG. 7 is a waveform diagram for describing another embodiment of the test erase voltage.

FIG. 7 is a waveform diagram for describing another embodiment of the test erase voltage.

Referring to FIG. 7, in step S530 of FIG. 5, during the test erase voltage application operation, the normal erase voltage Vera_normal used during the normal erase operation is applied to the source line SL or the source line SL and the bit line BL of the selected memory block, and the test erase voltage application operation is stopped before reaching a flat section of the normal erase voltage Vera_normal. Therefore, during the test erase voltage application operation, the test erase voltage Vera_test lower than a flat potential of the normal erase voltage Vera_normal may be applied to the source line SL or the source line SL and the bit lines BL of the selected memory block.

As another embodiment, in step S530 of FIG. 5, during the test erase voltage application operation, the normal erase voltage Vera_normal used during the normal erase operation is applied to the source line SL or the source line SL and the bit line BL of the selected memory block, and a voltage higher than the ground voltage may be applied to the word lines of the selected memory block. Therefore, a potential level difference between a gate of the memory cells and a channel of the memory cell is reduced, and thus the threshold voltage of the abnormal memory cells among the memory cells included in the selected memory block may be decreased.

Figure 8:
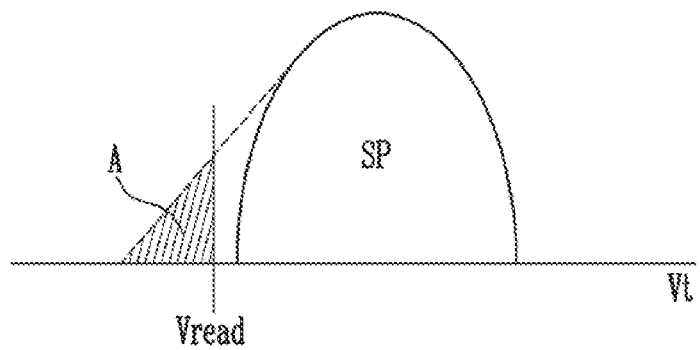
FIG. 8 is a threshold voltage distribution diagram for describing a detection operation of abnormal memory cells of FIG. 5.

FIG. 8 is a threshold voltage distribution diagram for describing the detection operation of the abnormal memory cells of FIG. 5.

Referring to FIG. 8, in step S540 of FIG. 5, the abnormal memory cells A of which the threshold voltage is lower than a threshold voltage distribution corresponding to the solid program state SP are detected. The detection operation of the abnormal memory cells may be performed as a read operation using a read voltage Vread lower than the lowest threshold voltage of the solid program state SP. That is, the memory cells having the threshold voltage lower than the read voltage Vread are detected among the memory cells included in the selected memory block, and the detected memory cells are determined as the abnormal memory cells A.

Figure 9:
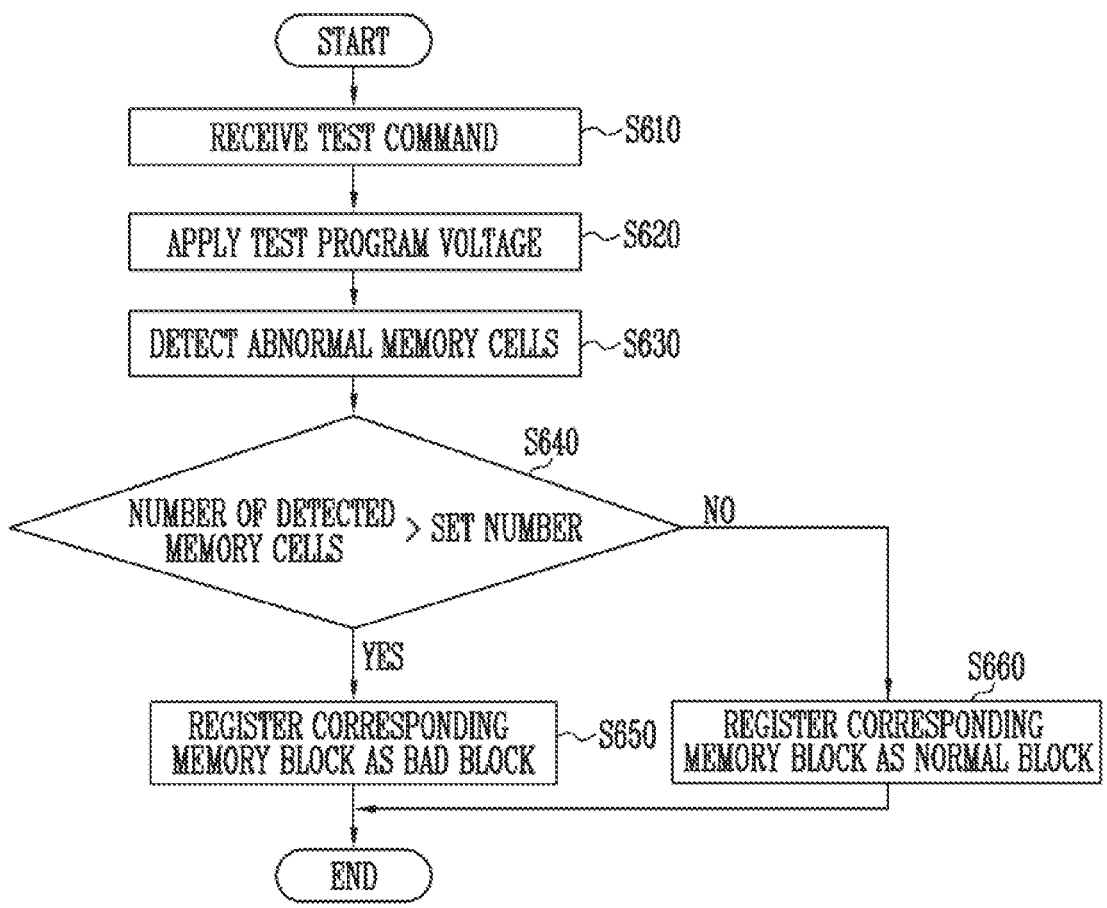
FIG. 9 is a flowchart for describing a method of operating the semiconductor memory device according to a second embodiment of the present disclosure.

FIG. 9 is a flowchart for describing a method of operating the semiconductor memory device according to a second embodiment of the present disclosure.

The method of operating the semiconductor memory device according to the second embodiment of the present disclosure will be described with reference to FIGS. 1 to 4 and 9 as follows.

In step S610, during the test operation, the selected semiconductor memory device 100 included in the memory device 1100 receives the test command Test_CMD from the controller 1200. The control logic 300 of the selected semiconductor memory device 100 may control the peripheral circuit 200 to perform the test operation on the selected memory block (for example, MB1) among the plurality of memory blocks MB1 to MBk included in the memory cell array 10, in response to the received test command Test_CMD. The selected memory block (for example, MB1) may be in the erase state. That is, all memory cells included in the selected memory block (for example, MB1) may be in the erase state.

In step S620, the peripheral circuit 200 applies the test program voltage to the word lines WL1 to WLn of the selected memory block MB1 under the control of the control logic 300. For example, the voltage generation circuit 210 generates and outputs the test program voltage, and the row decoder 220 applies the test program voltage to the word lines WL1 to WLn of the selected memory block MB1. The row decoder 220 may sequentially apply the test program voltage to the word lines WL1 to WLn of the selected memory block MB1, or simultaneously apply the test program voltage to the word lines WL1 to WLn of the selected memory block MB1. The test program voltage may be a program voltage of which a potential level is lower than that of the program voltage used during the program operation of the semiconductor memory device 100, that is, a normal program voltage.

When the test program voltage is applied to the word lines WL1 to WLn of the selected memory block MB1, since the test program voltage is lower than the normal program voltage, the threshold voltage of the normal memory cells among the memory cells included in the selected memory block MB1 is not changed, and the threshold voltage of the abnormal memory cells of which a program speed is fast is increased.

The above-described test program voltage application operation may be repeatedly performed for a set number of times. For example, the test program voltage application operation may be repeatedly performed 100 times to 1000 times.

In step S630, after the test program voltage application operation is completed, the abnormal memory cells of which the threshold voltage is increased are detected. For example, the peripheral circuit 200 detects memory cells having a threshold voltage higher than the highest threshold voltage of the solid program state among the plurality of memory cells included in the selected memory block MB1. The detection operation of the abnormal memory cells may be performed as a read operation using a read voltage of which a potential is equal to or higher than the highest threshold voltage of the solid program state.

In step S640, it is determined whether the number of detected abnormal memory cells is greater than a set number. For example, the page buffer group 230 generates and outputs the page buffer voltage VPB according to the number of abnormal memory cells detected during the detection operation of the above-described abnormal memory cells, that is, the memory cells having the threshold voltage higher than the highest threshold voltage of the solid program state. The fail bit counter 260 counts the number of abnormal memory cells based on a potential of the page buffer voltage VPB, and generates and outputs the fail bit Fail_bit. The control logic 300 determines whether the number of abnormal memory cells is greater than the set number based on the fail bit Fail_bit.

When it is determined that the number of detected abnormal memory cells is greater than the set number as a result of the determination of step S640 described above (Yes), the selected memory block MB1 is determined as the bad block and is registered in the memory block management block 1210. For example, when the number of abnormal memory cells among the memory cells included in the selected memory block MB1 is greater than the set number, the control logic 300 generates and outputs the bad block information BB_info, and the memory block management block of the controller 1200 registers the selected memory block MB1 as the bad block based on the bad block information BB_info and manages the selected memory block MB1.

When it is determined that the number of detected memory cells is equal to or less than the set number as a result of the determination of step S640 described above (No), the selected memory block MB1 is determined as the normal block and is registered in the memory block management block 1210.

According to the above-described embodiment of the present disclosure, the test program voltage lower than the normal program voltage is applied to the memory cells included in the selected memory block of the erase state to detect the abnormal memory cells of which the threshold voltage is increased. When the number of detected abnormal memory cells is greater than the set number, the corresponding memory block may be determined as the bad block.

In the above-described embodiment of the present disclosure, the test program operation and the abnormal memory cells detection operation are performed on all memory cells included in the selected memory block. However, the test program voltage application operation and the abnormal memory cells detection operation may be performed on some of the memory cells included in the selected memory block. For example, the test program voltage application operation and the abnormal memory cells detection operation may be selectively performed on memory cells included in at least one page among a plurality of pages included in the selected memory block or memory cells included in at least one string among a plurality of strings included in the selected memory block. Alternatively, the test program voltage application operation and the abnormal memory cells detection operation may be selectively performed on memory cells selected by, for example but not limited to, a checkerboard method among the plurality of memory cells included in the selected memory block.

Figure 10:
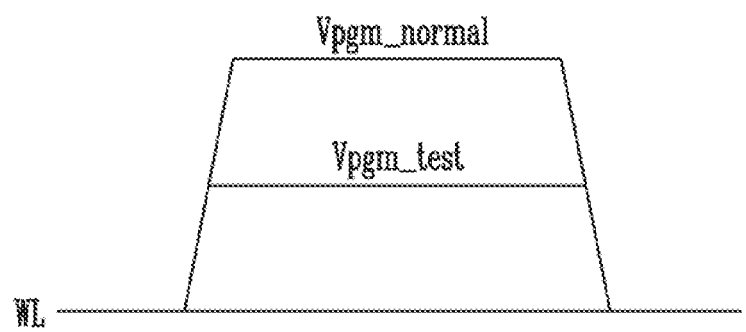
FIG. 10 is a waveform diagram for describing a test program voltage during a test program voltage application operation of FIG. 9.

FIG. 10 is a waveform diagram for describing the test program voltage during the test program voltage application operation of FIG. 9.

Referring to FIG. 10, the test program voltage Vpgm_test applied to the word lines WL in step S620 of FIG. 9 has a potential level lower than that of the normal program voltage Vpgm_normal used during the program operation of the semiconductor memory device, that is, the normal program operation.

Figure 11:
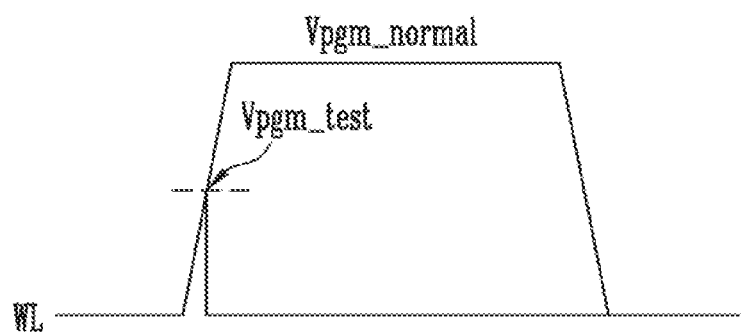
FIG. 11 is a waveform diagram for describing another embodiment of the test program voltage.

FIG. 11 is a waveform diagram for describing another embodiment of the test program voltage.

Referring to FIG. 11, in step S620 of FIG. 9, during the test erase voltage application operation, the normal program voltage Vpgm_normal used during the normal program operation is applied to the word lines WL of the selected memory block, and the test program voltage application operation is stopped before the normal program voltage Vpgm_normal reaches a flat section. Therefore, during the test program voltage application operation, the test program voltage Vpgm_test lower than a flat potential of the normal program voltage Vpgm_normal may be applied to the word lines WL of the selected memory block.

As another embodiment, in step S620 of FIG. 9, during the test program voltage application operation, a channel of the selected memory block may be precharged to a state higher than a channel potential during the normal program operation, and the normal program voltage Vpgm_normal may be applied to the word lines of the selected memory block. Therefore, a potential difference between a gate of the memory cells and a channel of the memory cell is reduced, and thus the threshold voltage of the abnormal memory cells among the memory cells included in the selected memory block may be increased.

Figure 12:
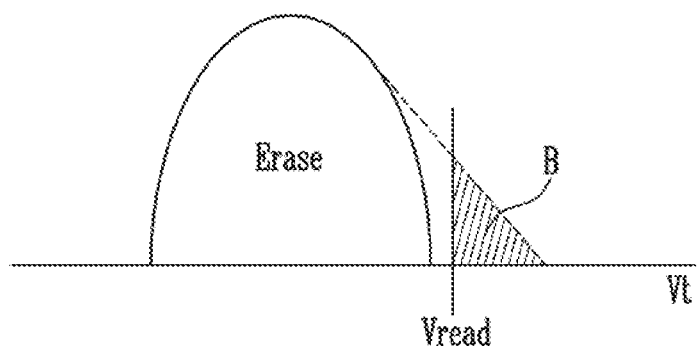
FIG. 12 is a threshold voltage distribution diagram for describing the detection operation of the abnormal memory cells of FIG. 9.

FIG. 12 is a threshold voltage distribution diagram for describing the detection operation of the abnormal memory cells of FIG. 9.

Referring to FIG. 12, in step S630 of FIG. 9, the abnormal memory cells B of which the threshold voltage is higher than a threshold voltage distribution corresponding to the erase state Erase are detected. The detection operation of the abnormal memory cells may be performed as a read operation using a read voltage Vread higher than the highest threshold voltage of the erase state Erase. That is, the memory cells having the threshold voltage higher than the read voltage Vread are detected among the memory cells included in the selected memory block, and the detected memory cells are determined as the abnormal memory cells B.

The test operation according to the above-described first embodiment and the test operation according to the second embodiment may be sequentially performed. For example, during the test operation, the semiconductor memory device may perform the test operation according to the first embodiment and then perform the test operation according to the second embodiment, or may perform the test operation according to the second embodiment and then perform the test operation according to the first embodiment.

Figure 13:
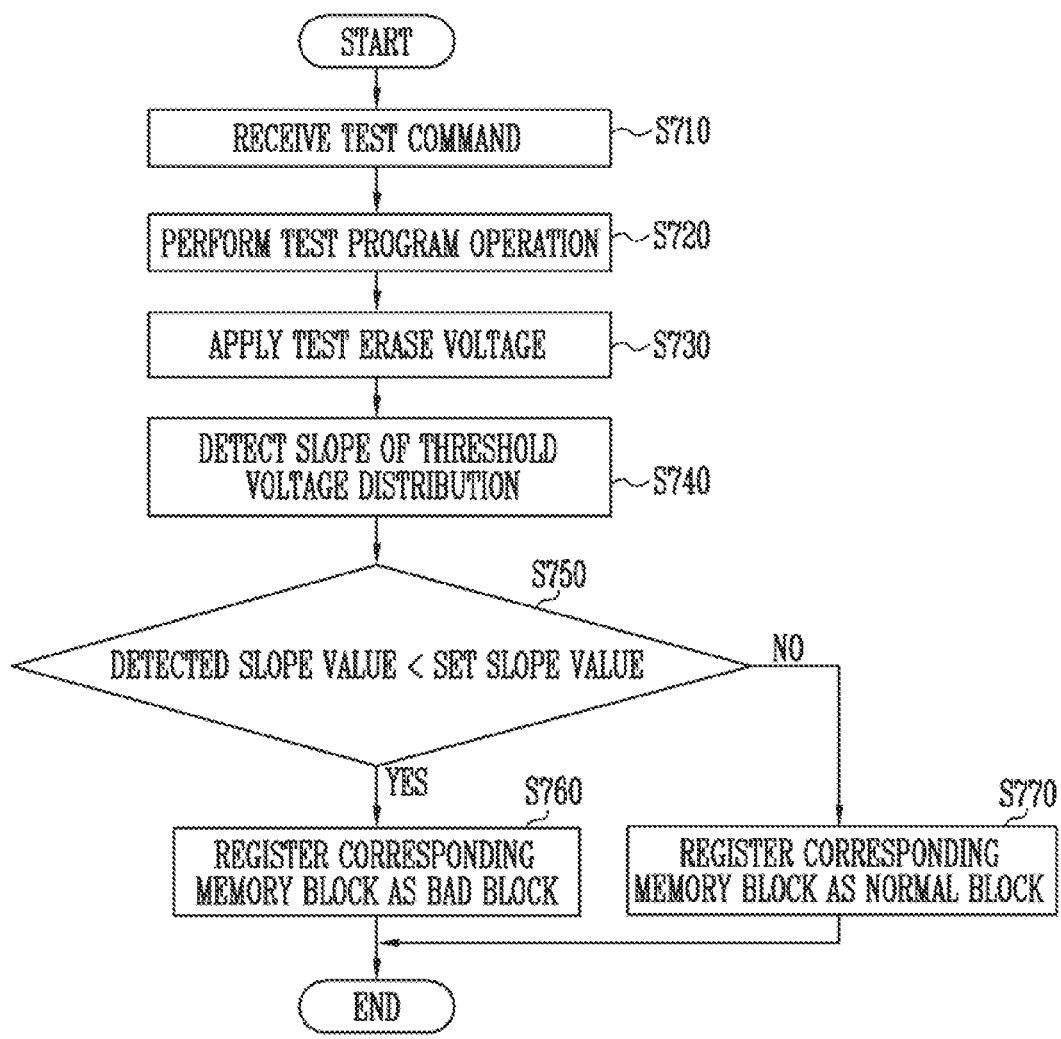
FIG. 13 is a flowchart for describing a method of operating the semiconductor memory device according to a third embodiment of the present disclosure.

FIG. 13 is a flowchart for describing a method of operating the semiconductor memory device according to a third embodiment of the present disclosure.

Figure 14:
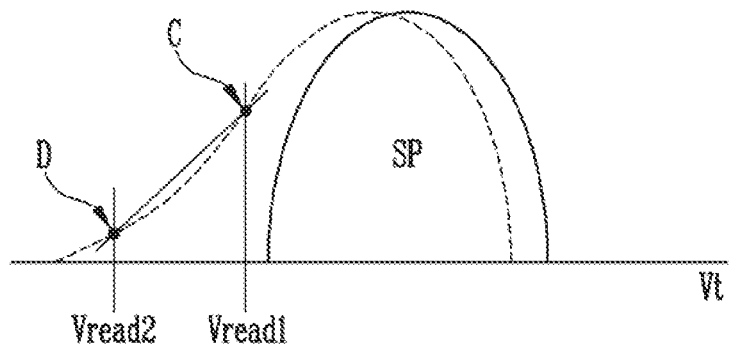
FIG. 14 is a threshold voltage distribution diagram for describing a slope detection operation of a threshold voltage distribution of FIG. 13.

FIG. 14 is a threshold voltage distribution diagram for describing a slope detection operation of a threshold voltage distribution of FIG. 13.

The method of operating the semiconductor memory device according to the third embodiment of the present disclosure will be described with reference to FIGS. 1 to 4, 13, and 14 as follows.

In step S710, during the test operation, the selected semiconductor memory device 100 included in the memory device 1100 receives the test command Test_CMD from the controller 1200. The control logic 300 of the selected semiconductor memory device 100 may control the peripheral circuit 200 to perform the test operation on the selected memory block (for example, MB1) among the plurality of memory blocks MB1 to MBk included in the memory cell array 10, in response to the received test command Test_CMD.

In step S720, the peripheral circuit 200 performs the test program operation on the selected memory block MB1 under the control of the control logic 300. For example, the memory cells included in the test program operation selected memory block MB1 are programmed in a solid program state. The solid program state may be a program state corresponding to a specific threshold voltage distribution of a potential higher than a threshold voltage distribution corresponding to the erase state. For example, the solid program state may have a threshold voltage distribution higher than 0V.

In an embodiment of the present disclosure, the memory cells included in the selected memory block MB1 are programmed in the solid program state during the test program operation, but are not limited thereto, and random data may be programmed in the memory cells included in the selected memory block MB1.

In step S730, a test erase voltage is applied to the selected memory block MB1 on which the test program operation is completed. The test erase voltage may be an erase voltage of which a potential level is lower than an erase voltage used during the erase operation of the semiconductor memory device 100, that is, a normal erase voltage.

For example, during the test erase voltage application operation, the source line driver 270 may apply the test erase voltage to the source line SL of the selected memory block MB1. The page buffers PB1 to PBm; 231 may apply the test erase voltage to the corresponding bit lines BL1 to BLm or float the bit lines BL1 to BLm during the test erase operation. During the test erase voltage application operation, the row decoder 220 may apply a ground voltage to the word lines WL of the selected memory block MB1.

When the test erase voltage is applied to the source line SL or the source line SL and the bit lines BL1 to BLm of the selected memory block MB1, since the test erase voltage is lower than the normal erase voltage, the threshold voltage of the normal memory cells among the memory cells included in the selected memory block MB1 is not changed, and the threshold voltage of the abnormal memory cells of which an erase speed is fast is decreased.

The above-described test erase voltage application operation may be repeatedly performed for a set number of times. For example, the test erase voltage application operation may be repeatedly performed 100 times to 1000 times.

The above-described test erase voltage application operation may be performed by applying the test erase voltage lower than the normal erase voltage to the source line or the source line and the bit line as shown in FIGS. 6 and 7 described above, or by applying the normal erase voltage to the source line or the source line and the bit line and applying a voltage higher than the ground voltage to the word line.

In step S740, after the test erase voltage application operation is completed, a slope of the threshold voltage distribution of the memory cells of the selected memory block MB1 is detected. For example, the peripheral circuit 200 performs a read operation using a first read voltage Vread1 on the selected memory block MB1 to detect first memory cells of which a threshold voltage is lower than the first read voltage, and the fail bit counter 260 counts the number of detected first memory cells and transmits the number of detected first memory cells to the control logic 300. In addition, the peripheral circuit 200 performs a read operation using a second read voltage Vread2 on the selected memory block MB1 to detect second memory cells of which a threshold voltage is lower than the second read voltage, and the fail bit counter 260 counts the number of detected second memory cells and transmits the number of detected second memory cells to the control logic 300. The control logic 300 detects the slope of the threshold voltage distribution of the selected memory block MB1, that is, a slope (C-D) of a left tail of the threshold voltage distribution of the selected memory block MB1, based on the number of first memory cells and the number of second memory cells.

The first read voltage Vread1 has a potential the same as or lower than the lowest threshold voltage of the solid program state, and the second read voltage Vread2 is lower than the first read voltage Vread1.

In an embodiment of the present disclosure, the slope of the left tail of the threshold voltage distribution of the selected memory block MB1 is detected by performing the read operation using the first read voltage Vread1 and the second read voltage Vread2. However, the slope of the left tail of the threshold voltage distribution of the selected memory block MB1 may be more accurately detected by performing a read operation using three or more read voltages.

In step S750, it is determined whether the detected slope value of the threshold voltage distribution is smaller than a set slope value by comparing the detected slope value of the threshold voltage distribution with the set slope value. For example, the set slope value may be a slope value of an intermediate threshold voltage and the lowest threshold voltage of the threshold voltage distribution of the solid program state SP.

When it is determined that the detected slope value of the threshold voltage distribution is smaller than the set slope value as a result of the determination of step S750 described above (Yes), the selected memory block MB1 is determined as the bad block and is registered in the memory block management block 1210. For example, when the number of abnormal memory cells among the memory cells included in the selected memory block MB1 is greater than the set number, the control logic 300 generates and outputs the bad block information BB_info, and the memory block management block of the controller 1200 registers the selected memory block MB1 as the bad block based on the bad block information BB_info and manages the selected memory block MB1.

When it is determined that the detected slope value of the threshold voltage distribution is equal to or greater than the set slope value as a result of the determination of step S750 described above (No), the selected memory block MB1 is determined as the normal block and is registered in the memory block management block 1210.

According to the above-described embodiment of the present disclosure, after programming the memory cells included in the selected memory block in a specific program state and applying the test erase voltage lower than the normal erase voltage, the slope of the left tail of the threshold voltage distribution of the memory cells is detected, and when the detected slope value is lower than the set slope value, the corresponding memory block may be determined as the bad block.

In the above-described embodiment of the present disclosure, the test program operation and the slope detection operation of the threshold voltage distribution are performed on all memory cells included in the selected memory block. However, the test program operation and the slope detection operation of the threshold voltage distribution may be performed on some of the memory cells included in the selected memory block. For example, the test program operation and the slope detection operation of the threshold voltage distribution may be selectively performed on memory cells included in at least one page among a plurality of pages included in the selected memory block or memory cells included in at least one string among a plurality of strings included in the selected memory block. Alternatively, the test program operation and the slope detection operation of the threshold voltage distribution may be selectively performed on memory cells selected by, for example but not limited to, a checkerboard method among the plurality of memory cells included in the selected memory block.

Figure 15:
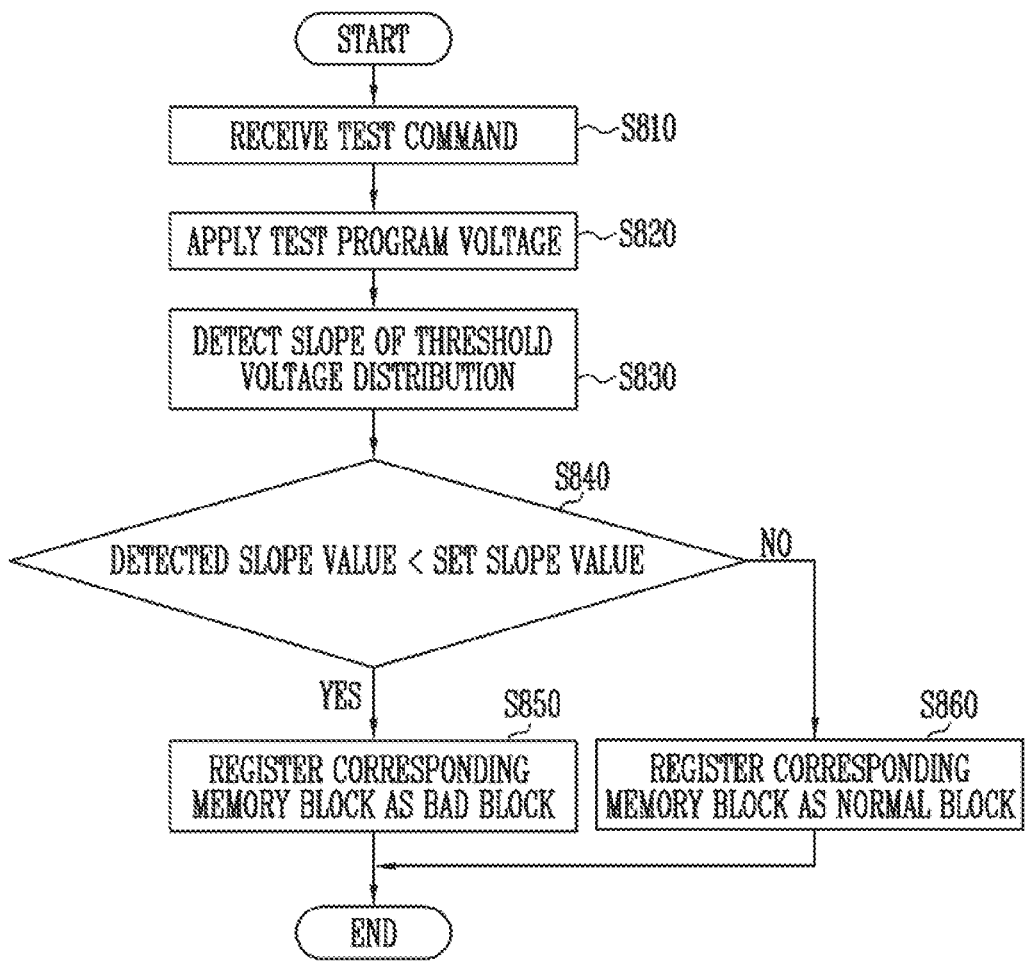
FIG. 15 is a flowchart for describing a method of operating the semiconductor memory device according to a fourth embodiment of the present disclosure.

FIG. 15 is a flowchart for describing a method of operating the semiconductor memory device according to a fourth embodiment of the present disclosure.

Figure 16:
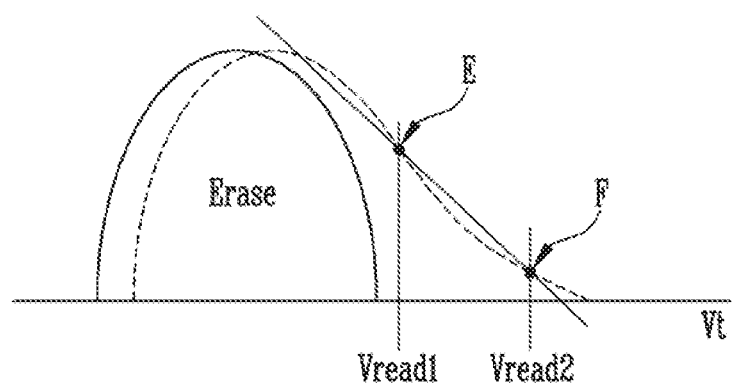
FIG. 16 is a threshold voltage distribution diagram for describing a slope detection operation of a threshold voltage distribution of FIG. 15.

FIG. 16 is a threshold voltage distribution diagram for describing a slope detection operation of a threshold voltage distribution of FIG. 15.

The method of operating the semiconductor memory device according to the fourth embodiment of the present disclosure will be described with reference to FIGS. 1 to 4, 15, and 16 as follows.

In step S810, during the test operation, the selected semiconductor memory device 100 included in the memory device 1100 receives the test command Test_CMD from the controller 1200. The control logic 300 of the selected semiconductor memory device 100 may control the peripheral circuit 200 to perform the test operation on the selected memory block (for example, MB1) among the plurality of memory blocks MB1 to MBk included in the memory cell array 10, in response to the received test command Test_CMD. The selected memory block (for example, MB1) may be in the erase state. That is, all memory cells included in the selected memory block (for example, MB1) may be in the erase state.

In step S820, the peripheral circuit 200 applies the test program voltage to the word lines WL1 to WLn of the selected memory block MB1 under the control of the control logic 300. For example, the voltage generation circuit 210 generates and outputs the test program voltage, and the row decoder 220 applies the test program voltage to the word lines WL1 to WLn of the selected memory block MB1. The row decoder 220 may sequentially apply the test program voltage to the word lines WL1 to WLn of the selected memory block MB1, or simultaneously apply the test program voltage to the word lines WL1 to WLn of the selected memory block MB1. The test program voltage may be a program voltage of which a potential level is lower than that of the program voltage used during the program operation of the semiconductor memory device 100, that is, a normal program voltage.

When the test program voltage is applied to the word lines WL1 to WLn of the selected memory block MB1, since the test program voltage is lower than the normal program voltage, the threshold voltage of the normal memory cells among the memory cells included in the selected memory block MB1 is not changed, and the threshold voltage of the abnormal memory cells of which a program speed is fast is increased.

The above-described test program voltage application operation may be repeatedly performed for a set number of times. For example, the test program voltage application operation may be repeatedly performed 100 times to 1000 times.

The above-described test program voltage application operation may be performed by applying the test program voltage lower than the normal program voltage to the word lines as shown in FIGS. 10 and 11 described above.

In step S830, after the test program voltage application operation is completed, a slope of the threshold voltage distribution of the memory cells of the selected memory block MB1 is detected. For example, the peripheral circuit 200 performs a read operation using a first read voltage Vread1 on the selected memory block MB1 to detect first memory cells of which a threshold voltage is higher than the first read voltage, and the fail bit counter 260 counts the number of detected first memory cells and transmits the number of detected first memory cells to the control logic 300. In addition, the peripheral circuit 200 performs a read operation using a second read voltage Vread2 on the selected memory block MB1 to detect second memory cells of which a threshold voltage is higher than the second read voltage, and the fail bit counter 260 counts the number of detected second memory cells and transmits the number of detected second memory cells to the control logic 300. The control logic 300 detects the slope of the threshold voltage distribution of the selected memory block MB1, that is, a slope (E-F) of a right tail of the threshold voltage distribution of the selected memory block MB1, based on the number of first memory cells and the number of second memory cells.

The first read voltage Vread1 has a potential the same as or lower than the highest threshold voltage of the solid program state, and the second read voltage Vread2 is higher than the first read voltage Vread1.

In an embodiment of the present disclosure, the slope of the right tail of the threshold voltage distribution of the selected memory block MB1 is detected by performing the read operation using the first read voltage Vread1 and the second read voltage Vread2. However, the slope of the right tail of the threshold voltage distribution of the selected memory block MB1 may be more accurately detected by performing a read operation using three or more read voltages.

In step S840, it is determined whether the detected slope value of the threshold voltage distribution is smaller than a set slope value by comparing the detected slope value of the threshold voltage distribution with the set slope value. For example, the set slope value may be a slope value of an intermediate threshold voltage and the highest threshold voltage of the threshold voltage distribution of the erase state Erase.

When it is determined that the detected slope value of the threshold voltage distribution is smaller than the set slope value as a result of the determination of step S840 described above (Yes), the selected memory block MB1 is determined as the bad block and is registered in the memory block management block 1210. For example, when the number of abnormal memory cells among the memory cells included in the selected memory block MB1 is greater than the set number, the control logic 300 generates and outputs the bad block information BB_info, and the memory block management block of the controller 1200 registers the selected memory block MB1 as the bad block based on the bad block information BB_info and manages the selected memory block MB1.

When it is determined that the detected slope value of the threshold voltage distribution is equal to or greater than the set slope value as a result of the determination of step S840 described above (No), the selected memory block MB1 is determined as the normal block and is registered in the memory block management block 1210.

According to the above-described embodiment of the present disclosure, after applying the test program voltage lower than the normal program voltage to the memory cells of the erase state included in the selected memory block, the slope of the right tail of the threshold voltage distribution is detected, and when the detected slope value is lower than the set slope value, the corresponding memory block may be determined as the bad block.

In the above-described embodiment of the present disclosure, the test program operation and the slope detection operation of the threshold voltage distribution are performed on all memory cells included in the selected memory block. However, the test program voltage application operation and the slope detection operation of the threshold voltage distribution may be performed on some of the memory cells included in the selected memory block. For example, the test program voltage application operation and the slope detection operation of the threshold voltage distribution may be selectively performed on memory cells included in at least one page among a plurality of pages included in the selected memory block or memory cells included in at least one string among a plurality of strings included in the selected memory block. Alternatively, the test program voltage application operation and the slope detection operation of the threshold voltage distribution may be selectively performed on memory cells selected by a checkerboard method among the plurality of memory cells included in the selected memory block.

Figure 17:
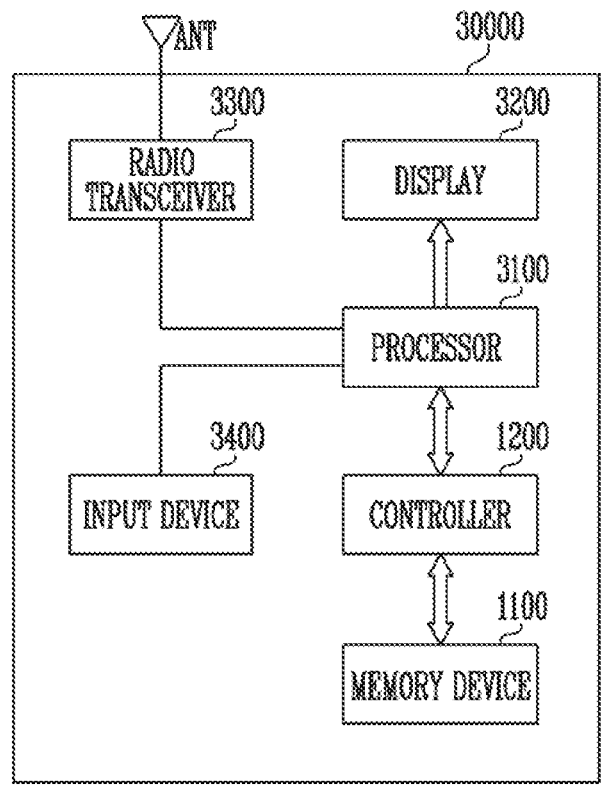
FIG. 17 is a diagram for describing another embodiment of the memory system.

FIG. 17 is a diagram for describing another embodiment of the memory system.

Referring to FIG. 17, a memory system 30000 may be implemented as a cellular phone, a smart phone, a tablet PC, a personal digital assistant (PDA) or a wireless communication device. The memory system 30000 may include the memory device 1100 and the controller 1200 capable of controlling the operation of the memory device 1100. The controller 1200 may control a data access operation, for example, a program operation, an erase operation, or a read operation, of the memory device 1100 under control of a processor 3100.

Data programmed in the memory device 1100 may be output through a display 3200 under the control of the controller 1200.

A radio transceiver 3300 may transmit and receive a radio signal through an antenna ANT. For example, the radio transceiver 3300 may convert a radio signal received through the antenna ANT into a signal that may be processed by the processor 3100. Therefore, the processor 3100 may process the signal output from the radio transceiver 3300 and transmit the processed signal to the controller 1200 or the display 3200. The controller 1200 may program the signal processed by the processor 3100 to the memory device 1100. In addition, the radio transceiver 3300 may convert a signal output from the processor 3100 into a radio signal, and output the converted radio signal to an external device through the antenna ANT. An input device 3400 may be a device capable of inputting a control signal for controlling the operation of the processor 3100 or data to be processed by the processor 3100. The input device 3400 may be implemented as a pointing device such as a touch pad or a computer mouse, a keypad, or a keyboard. The processor 3100 may control an operation of the display 3200 so that data output from the controller 1200, data output from the radio transceiver 3300, or data output from the input device 3400 is output through the display 3200.

According to an embodiment, the controller 1200 capable of controlling the operation of memory device 1100 may be implemented as a part of the processor 3100 and may also be implemented as a chip separate from the processor 3100.

Figure 18:
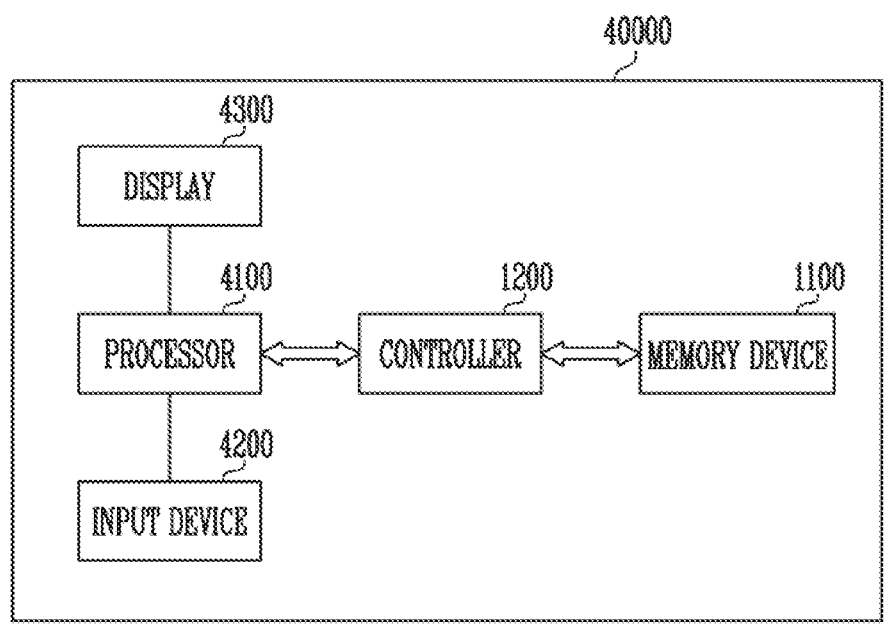
FIG. 18 is a diagram for describing another embodiment of the memory system.

FIG. 18 is a diagram for describing another example of the memory system.

Referring to FIG. 18, a memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include the memory device 1100 and the controller 1200 capable of controlling a data process operation of the storage device 1100.

A processor 4100 may output data stored in the memory device 1100 through a display 4300, according to data input through an input device 4200. For example, the input device 4200 may be implemented as a point device such as a touch pad or a computer mouse, a keypad, or a keyboard.

The processor 4100 may control the overall operation of the memory system 40000 and control the operation of the controller 1200. According to an embodiment, the controller 1200 capable of controlling the operation of memory device 1100 may be implemented as a part of the processor 4100 or may be implemented as a chip separate from the processor 4100.

Figure 19:
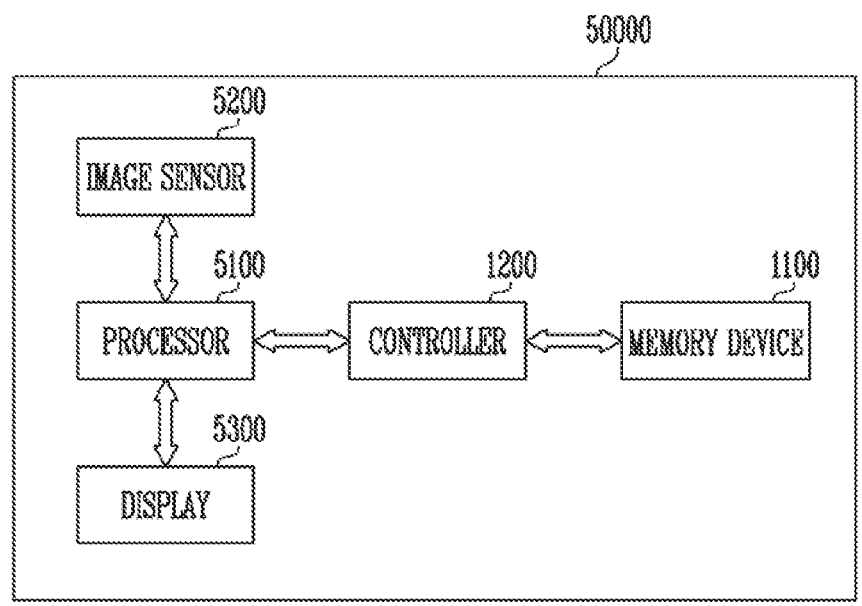
FIG. 19 is a diagram for describing another embodiment of the memory system.

FIG. 19 is a diagram for describing another embodiment of the memory system.

Referring to FIG. 19, a memory system 50000 may be implemented as an image processing device, for example, a digital camera, a portable phone provided with a digital camera, a smart phone provided with a digital camera, or a tablet PC provided with a digital camera.

The memory system 50000 includes the memory device 1100 and the controller 1200 capable of controlling a data process operation, for example, a program operation, an erase operation, or a read operation, of the memory device 1100.

An image sensor 5200 of the memory system 50000 may convert an optical image into digital signals. The converted digital signals may be transmitted to a processor 5100 or the controller 1200. Under control of the processor 5100, the converted digital signals may be output through a display 5300 or stored in the memory device 1100 through the controller 1200. In addition, data stored in the memory device 1100 may be output through the display 5300 under the control of the processor 5100 or the controller 1200.

According to an embodiment, the controller 1200 capable of controlling the operation of memory device 1100 may be implemented as a part of the processor 5100 or may be implemented as a chip separate from the processor 5100.

Figure 20:
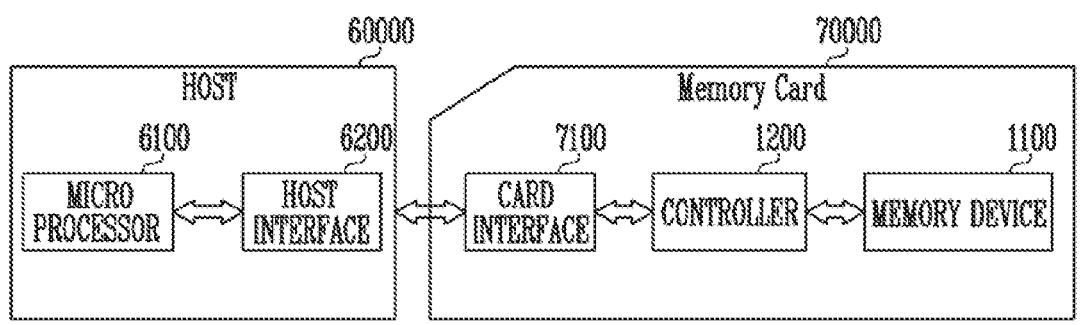
FIG. 20 is a diagram for describing another embodiment of the memory system.

FIG. 20 is a diagram for describing another embodiment of the memory system.

Referring to FIG. 20, a memory system 70000 may be implemented as a memory card or a smart card. The memory system 70000 may include the memory device 1100, the controller 1200, and a card interface 7100.

The controller 1200 may control data exchange between the memory device 1100 and the card interface 7100. According to an embodiment, the card interface 7100 may be a secure digital (SD) card interface or a multi-media card (MMC) interface, but is not limited thereto. In addition, the controller 1200 may be implemented through an example of the controller 1200 shown in FIG. 2.

The card interface 7100 may interface data exchange between a host 60000 and the controller 1200 according to a protocol of the host 60000. According to an embodiment, the card interface 7100 may support a universal serial bus (USB) protocol, and an interchip (IC)-USB protocol. Here, the card interface may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a mobile phone, a console video game hardware, or a digital set-top box, the interface 6200 may perform data communication with the memory device 1100 through the card interface 7100 and the controller 1200 under control of a microprocessor 6100.

Although the detailed description of the present disclosure describes some embodiments, various changes and modifications may be made without departing from the scope and technical spirit of the present disclosure. Therefore, the scope of the present disclosure should not be limited to the above-described embodiments, and should be determined by the equivalents of the claims of the present disclosure as well as the following claims.

What is claimed is:

1. A semiconductor memory device comprising:
    a memory block including memory cells;
    a peripheral circuit configured to program the memory cells to a set program state during a test operation and perform a test erase voltage application operation on the memory cells programmed to the set program state; and
    control logic configured to control the peripheral circuit to detect and count memory cells having a threshold voltage lower than a lowest threshold voltage of the set program state among the memory cells after the test erase voltage application operation is performed.

2. The semiconductor memory device of claim 1, wherein during the test erase voltage application operation, the peripheral circuit applies a test erase voltage to a source line of the memory block, or applies the test erase voltage to the source line and a bit line of the memory block.

3. The semiconductor memory device of claim 2, wherein the test erase voltage is a voltage lower than a normal erase voltage used during a normal erase operation.

4. The semiconductor memory device of claim 1, wherein during the test erase voltage application operation, the peripheral circuit applies a test erase voltage to a source line or both the source line and a bit line, and stops an increase in the test erase voltage before the test erase voltage equals a normal erase voltage.

5. The semiconductor memory device of claim 1, wherein during the test erase voltage application operation, the peripheral circuit applies an erase voltage to a source line of the memory block and applies a voltage greater than a ground voltage to word lines of the memory block.

6. The semiconductor memory device of claim 1, wherein the peripheral circuit repeatedly performs the test erase voltage application operation for a set number of times.

7. The semiconductor memory device of claim 1, wherein the control logic determines the memory block as a bad block when a number of the counted memory cells is greater than a set number.

8. A semiconductor memory device comprising:
a memory block including memory cells;
a peripheral circuit configured to program the memory cells in a set program state during a test operation and perform a test erase voltage application operation on the memory cells programmed in the set program state; and
control logic configured to control the peripheral circuit to measure a slope of a left tail of a threshold voltage distribution of the memory cells,
wherein the control logic determines the memory block as a bad block when the measured slope of the left tail is less than a set slope.

9. The semiconductor memory device of claim 8, wherein during the test erase voltage application operation, the peripheral circuit applies a test erase voltage to a source line of the memory block, or applies the test erase voltage to the source line and a bit line of the memory block.

10. The semiconductor memory device of claim 9, wherein the test erase voltage is a voltage lower than a normal erase voltage used during a normal erase operation.

11. The semiconductor memory device of claim 8, wherein during the test erase voltage application operation, the peripheral circuit applies a test erase voltage to a source line or the source line and a bit line, and stops an increase in the test erase voltage before the test erase voltage equals a normal erase voltage.

12. The semiconductor memory device of claim 8, wherein during the test erase voltage application operation, the peripheral circuit applies an erase voltage to a source line of the memory block and applies a voltage greater than a ground voltage to word lines of the memory block.

13. The semiconductor memory device of claim 8, wherein the peripheral circuit repeatedly performs the test erase voltage application operation for a set number of times.

14. A semiconductor memory device comprising:
a memory block including memory cells in an erase state;
a peripheral circuit configured to perform a test program voltage application operation on the memory cells in the erase state during a test operation; and
control logic configured to control the peripheral circuit to measure a slope of a right tail of a threshold voltage distribution of the memory cells,
wherein the control logic determines the memory block as a bad block when the measured slope of the right tail is less than a set slope.

15. The semiconductor memory device of claim 14, wherein the peripheral circuit sequentially or simultaneously applies a test program voltage to a plurality of word lines of the memory block during the test program voltage application operation.

16. The semiconductor memory device of claim 15, wherein the test program voltage is a voltage less than a normal program voltage used during a normal program operation.

17. The semiconductor memory device of claim 14, wherein during the test program voltage application operation, the peripheral circuit applies a test program voltage to word lines of the memory block, and stops an increase in the test program voltage before the test program voltage equals a normal program voltage.

18. The semiconductor memory device of claim 14, wherein the peripheral circuit repeatedly performs the test program voltage application operation for a set number of times.

* * * * *